US008467482B2

(12) United States Patent
Park et al.

(10) Patent No.: US 8,467,482 B2
(45) Date of Patent: Jun. 18, 2013

(54) APPARATUS AND METHOD FOR IDENTIFYING TRANSMITTER IN DIGITAL BROADCASTING SYSTEM

(75) Inventors: Sung-Ik Park, Daejon (KR); Heung-Mook Kim, Daejon (KR); Md. Jahidur Rahman, London (CA); Xianbin Wang, London (CA)

(73) Assignees: Electronics and Telecommunications Research Institute, Daejon (KR); University of Western Ontario, London, Ontario (CA)

( * ) Notice: Subject to any disclaimer, the term of this patent is extended or adjusted under 35 U.S.C. 154(b) by 593 days.

(21) Appl. No.: 12/753,255

(22) Filed: Apr. 2, 2010

(65) Prior Publication Data

US 2010/0254498 A1 Oct. 7, 2010

Related U.S. Application Data

(60) Provisional application No. 61/166,301, filed on Apr. 3, 2009.

(30) Foreign Application Priority Data

Dec. 21, 2009 (KR) ........................ 10-2009-0128527

(51) Int. Cl.
*H03D 1/00* (2006.01)

(52) U.S. Cl.
USPC ........... 375/343; 375/148; 375/260; 375/150; 375/340; 375/316; 370/510; 370/503; 370/509; 725/116; 725/117

(58) Field of Classification Search
USPC .......... 375/260, 349, 316, 350, 148; 725/116; 370/510
See application file for complete search history.

(56) References Cited

U.S. PATENT DOCUMENTS

| | | | | |
|---|---|---|---|---|
| 6,075,823 | A | 6/2000 | Sonoda | |
| 6,128,337 | A | 10/2000 | Schipper et al. | |
| 6,304,299 | B1 | 10/2001 | Frey et al. | |
| 6,437,832 | B1 | 8/2002 | Grabb et al. | |
| 7,202,914 | B2 | 4/2007 | Wu et al. | |
| 7,307,666 | B2 | 12/2007 | Wu et al. | |
| 7,792,156 | B1 * | 9/2010 | Lee et al. | 370/510 |
| 7,961,801 | B2 * | 6/2011 | Yan et al. | 375/260 |
| 2004/0187162 | A1 * | 9/2004 | Wu et al. | 725/116 |
| 2005/0111528 | A1 * | 5/2005 | Fulghum et al. | 375/148 |
| 2005/0117070 | A1 * | 6/2005 | Wu et al. | 348/725 |
| 2006/0126705 | A1 * | 6/2006 | Bachl et al. | 375/148 |
| 2011/0151809 | A1 * | 6/2011 | Lim et al. | 455/115.1 |

OTHER PUBLICATIONS

Md. Jahidur Rahman, et al; "A Novel Three-Stage ATSC TxID Identifier for Robust Data Broadcasting", IEEE International Symposium on Broadband Multimedia Systems and Broadcasting, 2009. BMSB '09, May 13-15, 2009, pp. 1-5.

* cited by examiner

*Primary Examiner* — Eva Puente
(74) *Attorney, Agent, or Firm* — Ladas & Parry LLP

(57) ABSTRACT

A method for identifying a transmitter in a digital broadcasting system includes: receiving a broadcast signal in which a TxID sequence for identification of a transmitter is embedded; correlating the received broadcast signal with a plurality of elementary code sequences of a pseudo-random sequence sequentially; and identifying the transmitter by using the correlation results.

14 Claims, 10 Drawing Sheets

(a)

(b)

APPARATUS AND METHOD FOR IDENTIFYING TRANSMITTER IN DIGITAL BROADCASTING SYSTEM

CROSS-REFERENCE(S) TO RELATED APPLICATIONS

The present application claims priority of provisional U.S. Patent Application No. 61/166,301 and Korean Patent Application No. 10-2009-0128527, filed on Apr. 3, 2009 and Dec. 21, 2009, respectively, which are incorporated herein by reference in their entirety.

BACKGROUND OF THE INVENTION

1. Field of the Invention

Exemplary embodiments of the present invention relate to an apparatus and method for identifying a transmitter; and, more particularly, to an apparatus and method for identifying a transmitter in a digital broadcasting system.

2. Description of Related Art

Since digital TV (DTV) transmitters are provided for broadcasters and consumers, the number of DTV transmitters increases recently with the development of DTV broadcasting. Thus, transmitter identification is researched as an important feature in the ATSC synchronization standard for distributed transmission. Through the transmitter identification technology, broadcast authorities and operators can identify interference sources or transmitters that are illegally operating in certain areas.

U.S. Pat. No. 7,202,914 (issued Apr. 10, 2007 to Yiyan Wu et al.) and U.S. Pat. No. 7,307,666 (issued Dec. 11, 2007 to Yiyan Wu et al.) disclose transmitter identification systems. These patents, however, fail to provide TxID sequence identification methods that are more efficient in terms of the computational complexity and the hardware complexity of an identifier.

On the other hand, U.S. Pat. No. 6,075,823 (issued Jun. 13, 2000 to Hideki Sonoda); U.S. Pat. No. 6,128,337 (issued Oct. 3, 2000 to Schipper et al.); U.S. Pat. No. 6,304,299 (issued Oct. 16, 2001 to Frey et al.); and U.S. Pat. No. 6,437,832 (issued Aug. 20, to Orabb et al.) disclose various methods for alleviating a multipath interference. These patents use a transmitted test signal and a filter construction to eliminate a noise from transmitted DTV signals. The patents, however, fail to provide a method for alleviating an unknown timing offset, a method for overcoming a synchronization problem, and an efficient combining method. The conventional method controls the network and requires a complicated filtering circuit for a receiver, which is not cost-effective.

SUMMARY OF THE INVENTION

An embodiment of the present invention is directed to a transmitter identification apparatus and method that identifies a watermark signal by using an identifier that provides efficient hardware implementation and low computational complexity in comparison with the conventional methods.

Another embodiment of the present invention is directed to a transmitter identification apparatus and method that overcomes the multipath problems by using a peak combination method that can greatly increase the DTV reception quality even in the worst-case multipath scenario.

Another embodiment of the present invention is directed to a transmitter identification apparatus and method that uses a method for alleviating an unknown timing offset.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a method for identifying a transmitter in a digital broadcasting system includes: receiving a broadcast signal in which a TxID sequence for identification of a transmitter is embedded; correlating the received broadcast signal with a plurality of elementary code sequences of a pseudo-random sequence sequentially; and identifying the transmitter by using the correlation results.

In accordance with another embodiment of the present invention, an apparatus for identifying a transmitter in a digital broadcasting system includes: a receiver unit configured to receive a broadcast signal in which a TxID sequence for identification of a transmitter is embedded; a correlation unit configured to correlate the received broadcast signal with a plurality of elementary code sequences of a pseudo-random sequence sequentially; and a decision unit configured to identify the transmitter by using the correlation results.

Accordingly, in accordance with the embodiments of the present invention, it is possible to provide low computational complexity and efficient hardware implementation in the identification of a transmitter in comparison with the conventional methods.

Furthermore, in accordance with the embodiments of the present invention, it is possible to greatly increase the DTV reception quality even in the worst-case multipath scenario by using a peak combination method.

Moreover, in accordance with the embodiments of the present invention, it is possible to alleviate an unknown timing offset.

DESCRIPTION OF SPECIFIC EMBODIMENTS

Figure 1:
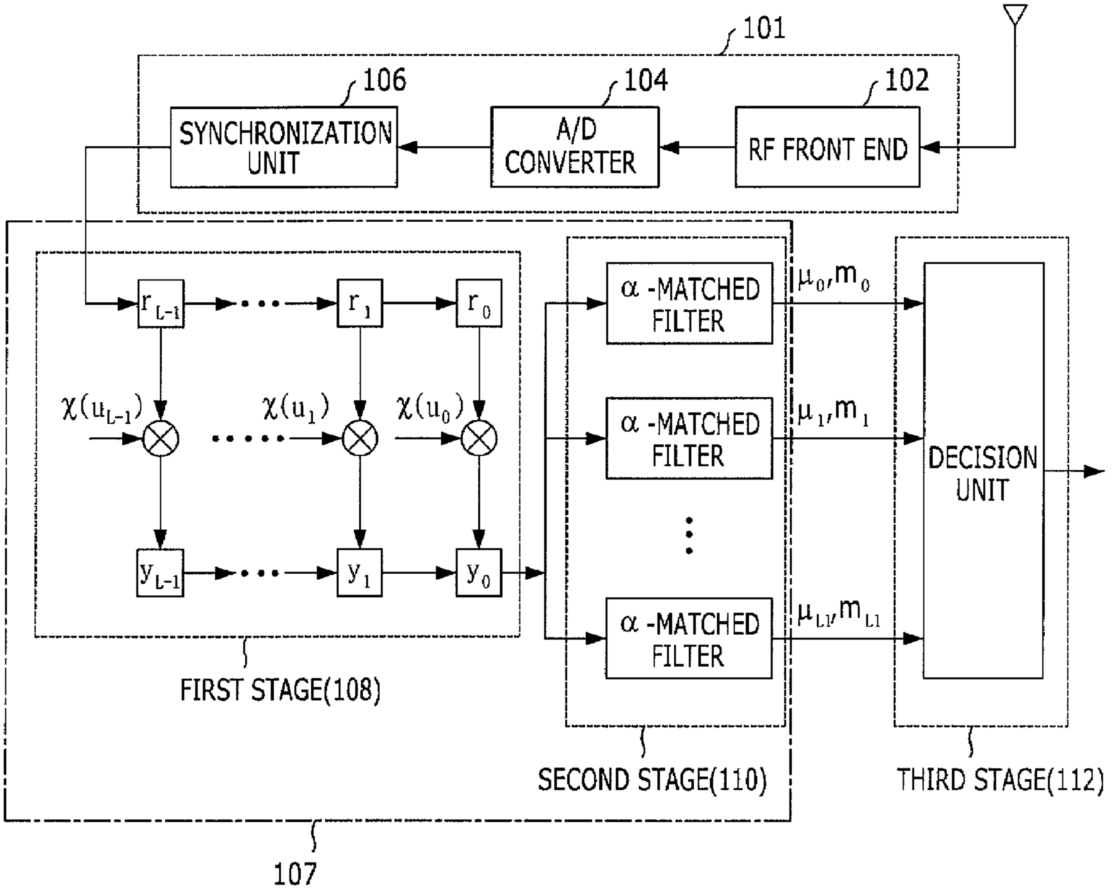
FIG. 1 is a block diagram of a transmitter identification apparatus in accordance with an embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In the following description of the present invention, detailed descriptions of well-known functions or configurations will be omitted since they would obscure the invention in unnecessary detail.

The present invention relates to an efficient transmitter identification apparatus and method for an ATSC DTV in an environment where an unknown timing offset is present; and, more particularly, to a transmitter identification apparatus and method for identifying a transmitter in a DTV broadcasting application that transmits a robust data stream with a low SNR and is used to control a distributed transmission for a DTV network.

A digital TV (DTV) transmitter transmits its own transmitter identification (TxID) by embedding the same in a DTV signal. Herein, the TxID is embedded in the form of a pseudo-random sequence. That is, the TxID is selected from a set of family of pseudo-random sequence and is embedded in each DTV signal. For example, the pseudo-random sequence may be a Kasami sequence.

For an $i^{th}$ transmitter, if a DTV signal before embedment of a pseudo-random sequence $x_i(n)$ is $s_i(n)$ and a DTV signal after embedment of a pseudo-random sequence $x_i(n)$ is $s'_i(n)$, the DTV signal $s'_i(n)$ after the embedment of the pseudo-random sequence $x_i(n)$ may be expressed as Equation 1.

$$\begin{aligned} s_i'(n) &= s_i(n) + \beta x_i(n) \\ &= s_i(n) + x_i'(n) \end{aligned} \quad \text{Eq. 1}$$

In Equation 1, β denotes a gain coefficient for controlling the embedding level of a TxID sequence, which may vary per transmitter according to system parameters.

The signal transmitted by the transmitter is received by a receiver through a channel $h_i$. Herein, the received signal may be expressed as Equation 2.

$$\begin{aligned} g_i(n) &= s_i'(n) \otimes h_i + w_i(n) \\ &= \{s_i(n) + x_i'(n)\} \otimes h_i + w_i(n) \\ &= \{s_i(n) \otimes h_i\} + \{x_i'(n) \otimes h_i\} + w_i(n) \\ &= s_i' + x_i'' + w_i \end{aligned} \quad \text{Eq. 2}$$

In Equation 2, $x''_i$ denotes a watermark signal received by the receiver and $w_i(n)$ denotes a noise for the $i^{th}$ transmitter.

If the family of pseudo-random sequences, for example, the large set of Kasami sequences includes M different sequences, the receiver must correlate with all of the local pseudo-random sequences within a library in order to detect a TxID sequence, i.e., $x''_i$ from the received signal.

Therefore, the TxID sequence is decided on the basis of the largest correlation peak among all the correlations. This means that if the family of TxID sequences is sufficiently large, the implementation complexity increases considerably because many correlators are necessary to detect the TxID.

If an optimal matched filter is used, and if the number of correlation detectors is M, the corresponding hardware complexity is O(M). In terms of multiplication requirements, the computational complexity is expressed as Equation 3.

$$C_{OMF} = M \times (2^n - 1). \quad \text{Eq. 3}$$

In Equation 3, M denotes the size of a code set and n denotes the degree of a Kasami sequence.

Figure 2:
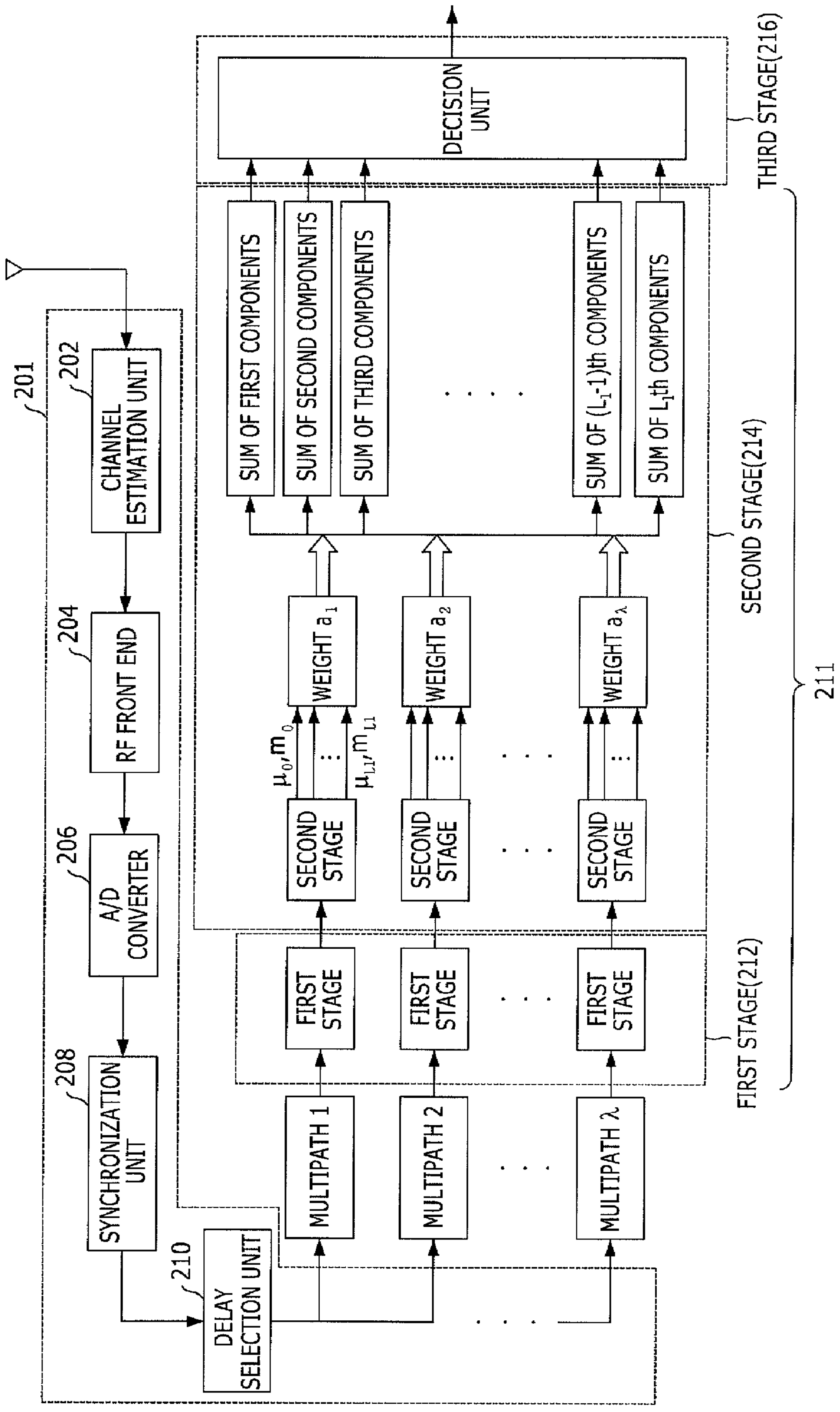
FIG. 2 is a block diagram of a transmitter identification apparatus in accordance with another embodiment of the present invention.

A transmitter identification method of the present invention according to FIGS. 1 and 2 considerably reduces the hardware complexity and the computational complexity, thus providing almost the same performance as the conventional optimal matched filter.

It is well known that the large set of Kasami sequences is the result of exclusive OR (XOR) of three elementary code sequences. If the three elementary code sequences are defined as a first elementary code sequence u, a second elementary code sequence C(u") and a third elementary code sequence S(u'), the u and u' form a preferred pair of binary m-sequences and the S(u') and C(u") are defined as Equations 4 and 5.

$$S(u') = \{0_L, u', Du', D^2u', \ldots, D^{L-1}u'\}, \quad \text{Eq. 4}$$

$$C(u'') \equiv 0_L \cup \cup D^{j-1}c = \{c_j, j=0, \ldots, L_1\}, \quad \text{Eq. 5}$$

In Equations 4 and 5, $0_L$ denotes an all-zero sequence with a length of L. ∪ denotes a union of sets. $c=[c_0, c_1, \ldots, c_{L1}]$ is the repetition of u" by $(2^{n/2}+1)$ times, wherein the u" has a period of $L_1=2^{n/2}-1$.

In order to determine the TxID sequence, i.e., in order to decide which sequence is embedded, the elements corresponding to the S(u') and C(u") must be detected in the received signal. Thus, in the transmitter identification method of the present invention, three elementary code sequences are sequentially correlated with the received sequence in order to decide the inserted TxID sequence.

A description will be given with reference to FIG. 1.

FIG. 1 is a block diagram of a transmitter identification apparatus in accordance with an embodiment of the present invention.

Referring to FIG. 1, a transmitter identification apparatus in accordance with an embodiment of the present invention includes a receiver unit 101, a correlation unit 107, and a decision unit 112.

The receiver unit 101 receives a broadcast signal in which a TxID sequence for identification of a transmitter is embedded. The receiver unit 101 may include an RF front end 102, an A/D converter 104, and a synchronization unit 106.

When the RF front end 102 receives a signal from the transmitter, the A/D converter 104 converts the received signal into a digital signal and the synchronization unit 106 performs a synchronization process.

The correlation unit 107 sequentially correlates the received signal of the receiver unit 101 with a plurality of elementary code sequences of a pseudo-random sequence. For example, as described above, it is well known that a Kasami sequence is the result of exclusive OR (XOR) of three elementary code sequences. Thus, the present invention sequentially correlates the received signal with three elementary code sequences of a Kasami sequence. The correlation unit 107 may include a first-stage processing unit 108 and a second-stage processing unit 110. This will be described later in detail.

The decision unit 112 identifies the transmitter by using the operation results of the correlation unit 107.

In this way, the transmitter identification apparatus uses the first-stage processing unit 108, the second-stage processing unit 110 and a third-stage processing unit 112 to detect a TxID of the transmitter from the received signal of the receiver unit 101. That is, the present invention relates to a 3-stage demodulator that detects and demodulates the TxID through three stages 108, 110 and 112. Herein, the transmitter identification apparatus may be a DTV broadcast receiver.

Referring to FIG. 1, $r=[r_0, r_1, \ldots, r_{L-1}]$ denotes a received sequence vector which includes an original DTV signal and an interference from a noise.

In the first-stage processing unit 108, a received sequence vector r is multiplied by an antipodal version $\chi(u)$ of a basic sequence. This may be expressed as Equation 6.

$$y_i = r_i \times \chi(u_i),\ i=0, \ldots, L-1 \quad \text{Eq. 6}$$

In the second-stage processing unit 110, a vector y is transferred to $S_c$ ($=L_1+1$) parallel $\alpha$-matched filters and each of the $\alpha$-matched filters corresponds to an elementary code sequence C(u"). In the $j^{th}$ $\alpha$-matched filter, the vector y is multiplied by $\chi(c_j)$ on an element-by-element basis. The resulting sequence may be expressed as Equation 7.

$$z_{j,i} = y_i \times \chi(c_{j,i}),\ i=0, \ldots, L-1,\ j=0, \ldots, L_1. \quad \text{Eq. 7}$$

Thereafter, in order to evaluate the correlations between each elements of $z_j$ and $\chi(S_m)$ (m=0, . . . , L) the $z_j$ is transferred through a matched filter corresponding to u' and the corresponding output is represented by $\mu_{j,m}$. Furthermore, each $\alpha$-matched filter selects a local maximum among the $\mu_{j,m}$ (m=0, . . . , L) and transfers the parameter $\mu_j$ and a related argument $m_j$ to the third-stage processing unit 112.

The third-stage processing unit 112 decides a global maximum among the $\mu_j$ (j=0, . . . , $L_1$). A TxID sequence is determined according to the argument j and the related $m_j$ by using the corresponding XOR operation.

Thus, the transmitter identification method of the present invention can identify and demodulate the TxID sequence with a considerably reduced hardware complexity. As described above, if the complexity of the conventional optimal matched filter is O(M), the transmitter identification method of the present invention has a hardware complexity of $O(M^{1/3})$ and the computational complexity is expressed as Equation 8.

$$C_{TSD} = S_C \times (2^n - 1) \quad \text{Eq. 8}$$

In Equation 8, $S_c$ denotes the number of a-matched filters.

Figure 3:
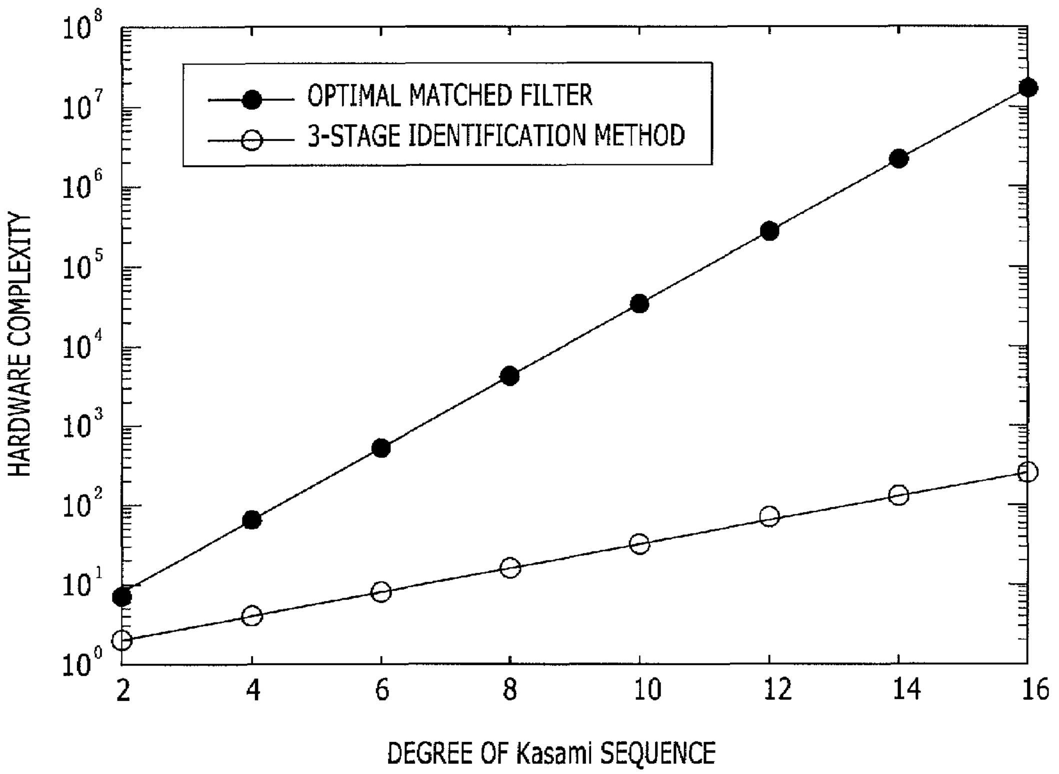
FIG. 3 is a graph comparing the hardware complexity of an optimal matched filter and the hardware complexity of a 3-stage identification method in accordance with the present invention.

For example, if n=16, the conventional optimal matched filter requires 16,777,216 matched filters. On the other hand, the transmitter identification method of the present invention requires only 256 matched filters in order to identify the same embedded TxID sequence. FIG. 3 illustrates the hardware complexity of an optimal matched filter and the hardware complexity of a 3-stage identification apparatus in accordance with the present invention.

FIG. 2 is a block diagram of a transmitter identification apparatus considering a multipath in accordance with another embodiment of the present invention. A description of an overlap with FIG. 1 will be omitted for conciseness.

Referring to FIG. 2, a transmitter identification apparatus in accordance with another embodiment of the present invention includes a receiver unit 201, a correlation unit 211, and a decision unit 216.

The receiver unit 201 may further include a channel estimation unit 202 and a delay selection unit 210 in addition to an RF front end 204, an A/D converter 206 and a synchronization unit 208. Herein, the RF front end 204 and the channel estimation unit 202 may change places with each other.

The delay selection unit 210 uses channel estimation information, estimated by the channel estimation unit 202, to select a delay signal (210) to output each multipath. Thereafter, the first stage and the second stage described with reference to FIG. 1 are performed on each multipath. A weight is given to the result value of the second stage for each multipath and then the $j^{th}$ components are added up to perform the third stage (216). The third stage is the same as described with reference to FIG. 1.

Figure 4:
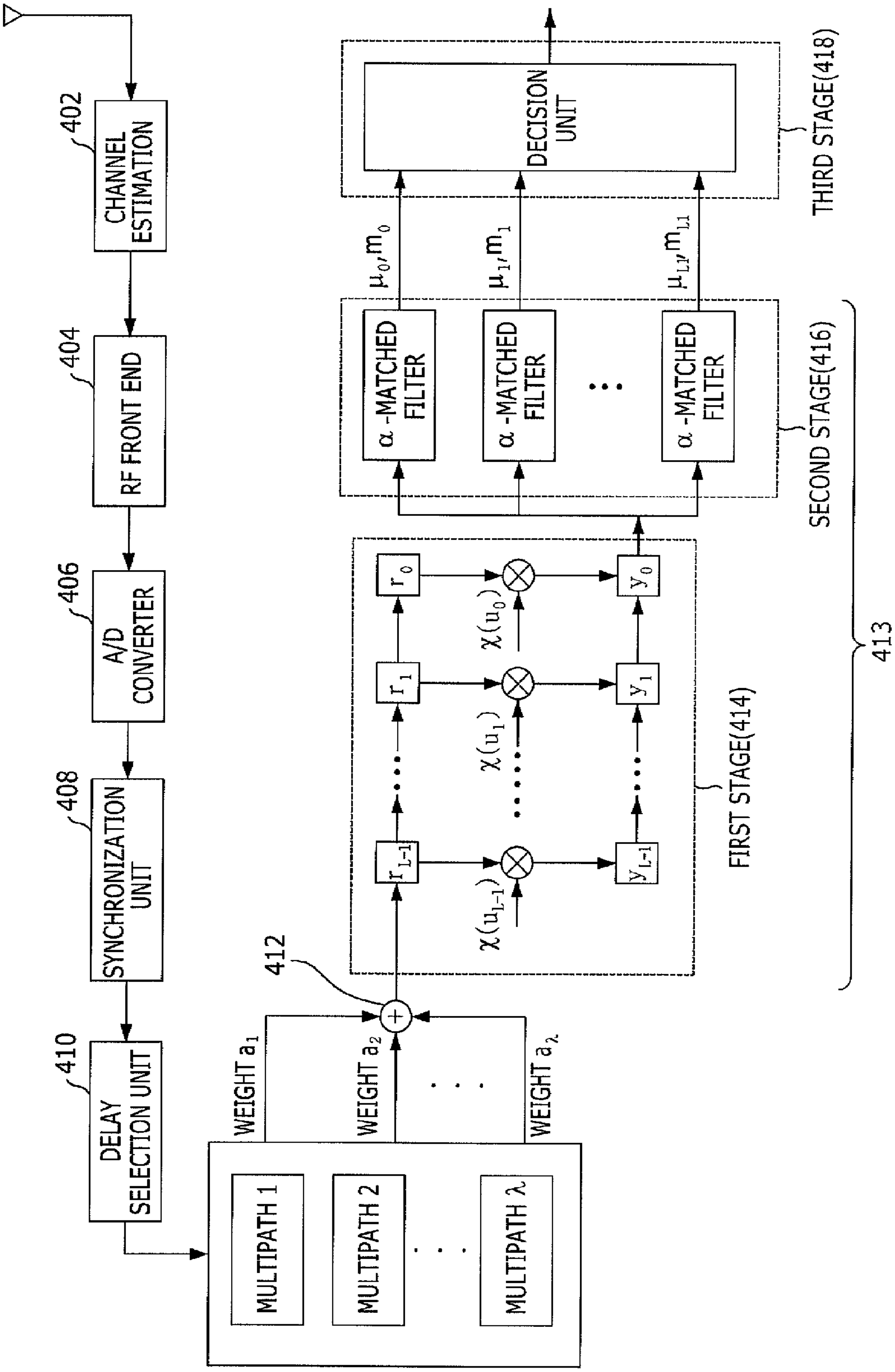
FIG. 4 is a block diagram of a transmitter identification apparatus in accordance with another embodiment of the present invention.

FIG. 4 illustrates a case where multipaths are combined at the beginning of a 3-stage demodulator (412) unlike FIG. 2. In this case, there is more interference from other multipaths, so that an error may be likely to occur in the decision of a TxID.

Figure 5:
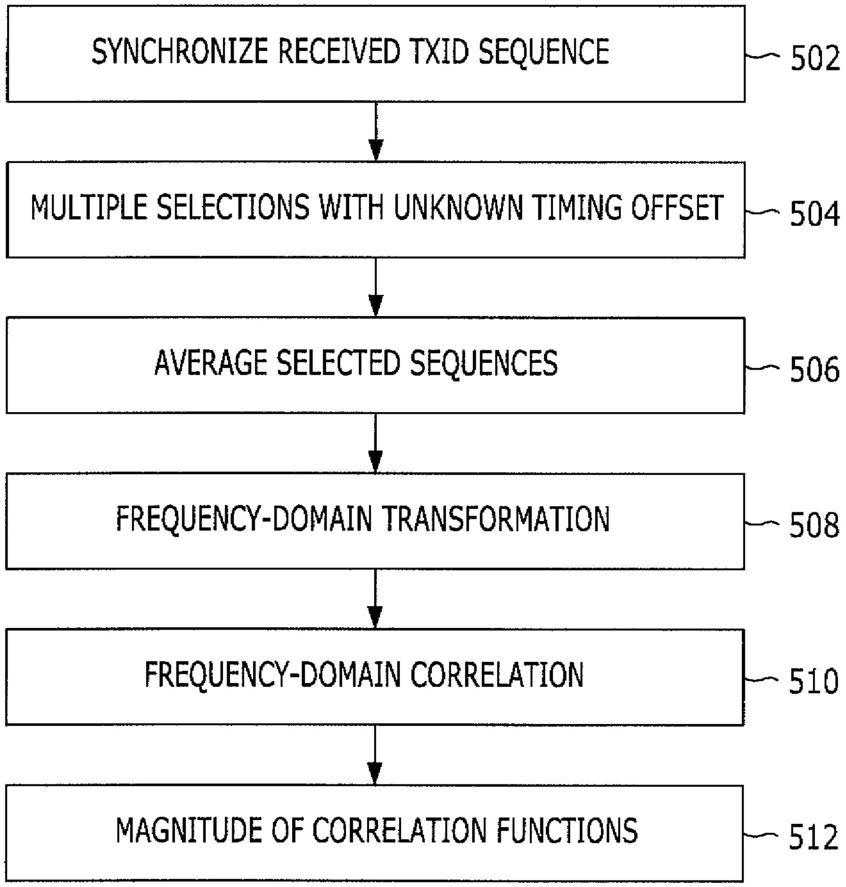
FIG. 5 is a flow diagram of a transmitter identification method in accordance with an embodiment of the present invention.

Referring to FIG. 5, because a timing offset between the transmitter and the receiver cannot be known in the case of a low Signal-to-Noise Ratio (SNR), a starting point of each TxID sequence cannot be known. Therefore, each received TxID sequence selected for correlation with a local signal has the time-domain sequence duration identical to the length of an original sequence, but the timing offset cannot be known. Consequently, each selected TxID may include a portion of an adjacent TxID. Herein, decision criteria may be significantly affected by a modulated sequence and an unmodulated sequence. What is therefore required is a method for alleviating an unknown timing offset at a low SNR.

In Equation 2, $x''_i$ is a watermark signal received by the receiver. Certainly a timing offset may be present at a low SNR when the sequence for decision is selected by the receiver. Referring to FIG. 5, a timing offset may be present at a low SNR even after a received TxID sequence is synchronized (502).

For alleviation of a noise effect, a sufficient number of the same sequences are selected (504) to take an average of all selections (506). According to the law of large numbers, if a sufficient number of selections are made, it is possible to obtain a sequence that has almost the same distribution as an original sequence. A TxID sequence has the duration equal to the length of an original TxID sequence, but it is selected including an unknown timing offset. Therefore, when an average is taken of multiple selections including an unknown timing offset, it is expressed as Equation 9.

$$\bar{r}_i(n) = \frac{1}{M}\sum_{m=1}^{M} x_{i,m}^{so}(n) \quad \text{Eq. 9}$$

In Equation 9, $x_{i,m}^{so} = x_{i,m}'' e^{\Psi_1}$ is a TxID selected by the receiver, which includes an unknown timing offset. A received signal must be correlated with a local pseudo-random sequence in order to detect each TxID. However, in this case, a frequency-domain correlation is performed in order to easily reduce the effect of an unknown timing offset. Thus, an N-point DFT is performed (508) to obtain Equation 10.

$$\overline{R}_i = \sum_{n=0}^{N-1} \bar{r}_i(n) e^{-j2\pi kn/N} \quad \text{Eq. 10}$$

In this stage, the following assumption is made on the basis of the length of a TxID sequence and the length of a channel. Because the sequence is very long and the channel length is sufficiently smaller than the sequence length, a linear convolution may approximate to a circular convolution. Therefore, it may be expressed as a product form in the frequency domain. On the basis of this assumption, Equation 10 may be expressed as Equation 11.

$$\begin{aligned}\overline{R}_i &= \frac{1}{M}\sum_{m=1}^{M}\{X'_{i,m}H_{i,m}e^{\psi_i}\} \\ &= \overline{X'_{i,m}H_{i,m}e^{\psi_i}}\end{aligned} \quad \text{Eq. 11}$$

When $\overline{R}_i(n)$ is correlated with a local signal $R_j(n)$, the result is expressed as Equation 12. Herein, $R_j(n)$ is also expressed in the frequency domain.

$$\begin{aligned}R_{\overline{R}_iR_j}(k) &= \frac{1}{N}\sum_{n=0}^{N-1}\overline{R}_i(n)R_j(n-k) \\ &= \rho R_{\overline{R}_iR_j}e^{\psi_j}, \text{ if } j=i\end{aligned} \quad \text{Eq. 12}$$

Thus, if j=i, a normalized autocorrelation function can be obtained. Therefore, when the magnitude of $R_{\overline{R}_iR_j}(k)$ is taken (512), a peak can be obtained without the effect of an uncorrected time offset and a decision for identification of each transmitter can be made on the basis of the obtained peak.

In most cases, because synchronization cannot be achieved, a portion of an adjacent TxID is selected. Under this condition, if a sequence from the adjacent TxID sequence has the opposite polarity to an indented TxID sequence, the amplitude of a correlation peak may be reduced.

If the sequences are selected perfectly and k=0, the first sample of a correlation peak can be obtained from Equation 12. If ¼ of an intended TxID sequence is selected from the adjacent sequence that has the opposite polarity to the intended TxID sequence and the first correlation peak resulting from ¼ of the adjacent sequence is 1, that is, if the ¼ portion is selected from the adjacent TxID sequence, a decision peak may be expressed as Equation 13.

$$R'_{\overline{R}_iR_j}(k)=\rho R_{\overline{R}_iR_j}e^{\psi_j}-2l \quad \text{Eq. 13}$$

Figure 6:
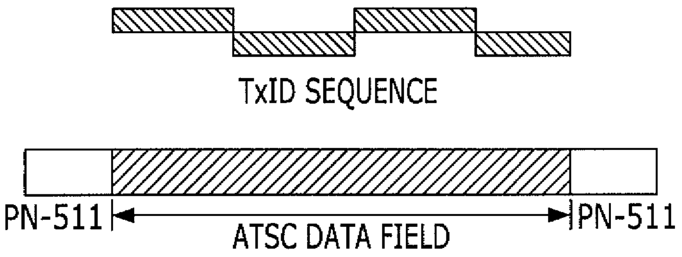
FIG. 6 is a diagram illustrating a polarity-modulated TxID sequence (a) and a correlation function (b) from the polarity-modulated TxID sequence.
Figure 6:
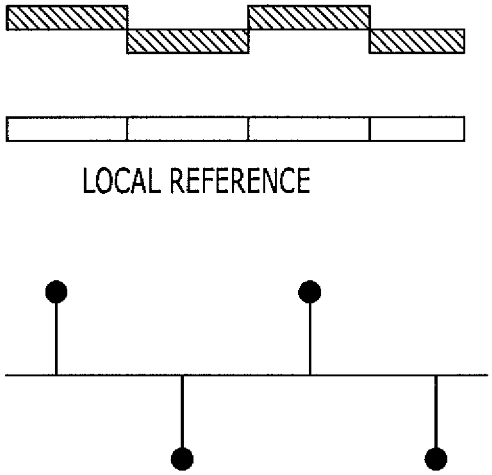

As can be seen from FIG. 6, the polarity modulation of TxIDs, whose TxID sequences continuously have the opposite polarity with respect to each other, may significantly affect a decision procedure. However, this can increase the coverage area of a DTV transmitter by a higher-order modulation technique, making it possible to robust data transmission.

Multipath correlation peaks resulting from the multipath effects are combined in order to make a correlation process adaptive to the multipath conditions. Herein, each path may be given a weight.

A multipath channel $h=[h_0, h^1, \ldots, h_{\lambda-1}]^T$ with λ taps is considered. A straightforward way for sequence detection uses a correlation peak according to the strongest path. Since a signal component from other multipaths becomes an interference in a detection process, the variance of a noise component for the $m^{th}$ peak is expressed as Equation 14.

$$\begin{aligned}\sigma'^2_{n,m} &= \sigma^2_{n,m} + \sigma'^2_s + \sigma^2_{DTV} \\ &= \lambda\left(\sigma^2_{w,m} + \sigma^2_s\sum_{l=0,l\neq m}^{\lambda-1}|h_l|^2 + \sigma^2_{DTV}\right) \\ &= \lambda(\sigma^2_{w,m} + \sigma^2_s + \sigma^2_{DTV}).\end{aligned} \quad \text{Eq. 14}$$

In Equation 14, $\sigma_w^2$, $\sigma_s^2$ and $\sigma_{DTV}^2$ denote the variance of additive white Gaussian noise (AWGN), a TxID signal and a DTV signal, respectively.

Figure 7:
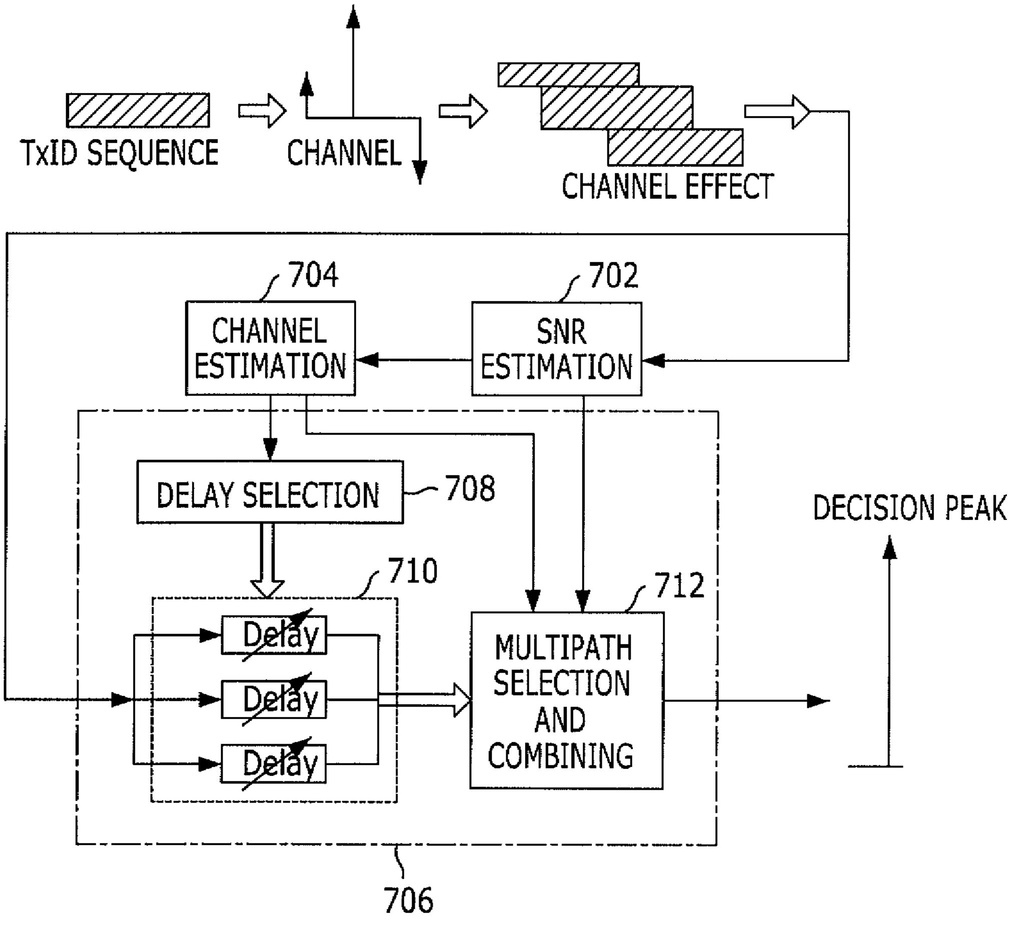
FIG. 7 is a block diagram of a peak combiner in accordance with an embodiment of the present invention.

Referring to FIG. 7, when a TxID sequence is received through a channel, the receiver estimates an SNR (702), estimates a channel (704) and combines peaks by a peak combiner 706 by using the SNR information and channel information (e.g., multipath information) obtained from the estimation results. By using the delay information 708 extracted from the channel information, the peak combiner 706 delays a received multipath signal (710) to combine the peaks (712).

In the peak combination according to FIG. 7, each correlation peak may be given a weight as Equation 15.

$$\rho_k = \sum_{m=0}^{\lambda-1}\frac{a_m}{\sigma'_{n,m}}\rho_{k,m} \quad \text{Eq. 15}$$

In Equation 15, with respect to the inserted $k^{th}$ sequence (TxID), $\rho_{k,m}$ denotes the amplitude of each correlation peak and $\alpha_m$ denotes the corresponding combination weight.

For obtainment of straightforward criteria for peak combination, the $\sigma'_{n,m}$ of Equation 14 is used to normalize the variance of the noise and interference with respect to each correlation peak.

When it is expressed in $\alpha'_m=\alpha_m/\sigma'_{n,m}$, the corresponding noise power in a combined peak is expressed as Equation 16.

$$N_k = \sum_{m=0}^{\lambda-1}a'^2_m. \quad \text{Eq. 16}$$

Therefore, after each multipath is given a weight, a combined SNR is expressed as Equation 17.

$$\gamma'[k] = \frac{\left(\sum_{m=0}^{\lambda-1}a'_m\rho_{k,m}\right)^2}{2\sum_{m=0}^{\lambda-1}a'^2_m}, \leq \frac{\sum_{m=0}^{\lambda-1}a'^2_m\sum_{m=0}^{\lambda-1}\rho^2_{k,m}}{2\sum_{m=0}^{\lambda-1}a'^2_m}. \quad \text{Eq. 17}$$

It can be seen that the combined SNR γ'[k] is maximized for $\alpha'_m=\rho_m/N_m$.

Iterative searches are necessary to select a correlation peak in a combination process. The first stage for this is to arrange correlation peaks sequentially in the order of SNR. A peak combination process starts from the largest correlation peak. Additional correlation peaks are combined with the largest correlation peak by being weighted one by one in the order of SNR. A peak combination procedure stops when the combination process reaches a predetermined threshold.

Hereinafter, a description will be given of an analysis of error rates for a transmitter identification method in accordance with the present invention.

Figure 8:
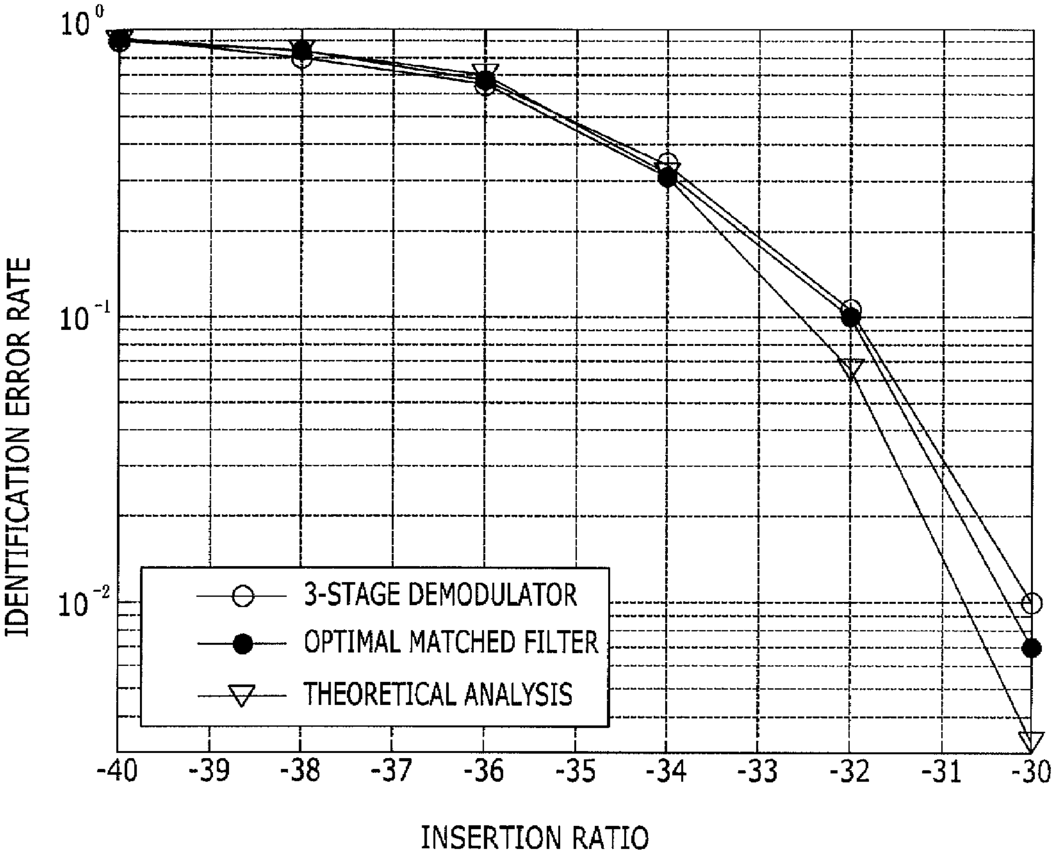
FIG. 8 is a graph comparing the identification error rate of a theoretical analysis, the identification error rate of an optimal matched filter, and the identification error rate of a 3-stage demodulator.

FIG. 8 is a graph comparing the identification error rate of a theoretical analysis, the identification error rate of an optimal matched filter, and the identification error rate of a 3-stage demodulator. Referring to FIG. 8, it can be seen that the 3-stage demodulator in accordance with the present invention can provide the same performance as the optimal matched filter and the analysis.

Figure 9:
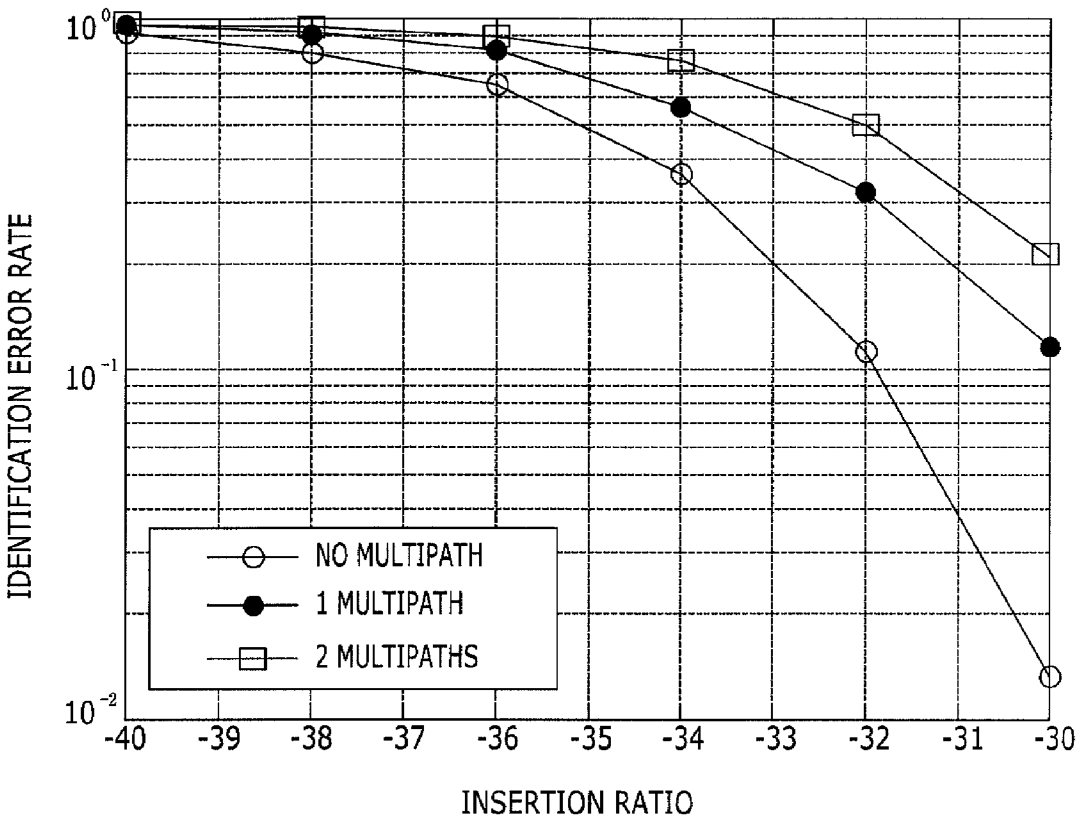
FIG. 9 is a graph comparing the identification error rates depending on the number of multipaths.

FIG. 9 is a graph comparing the identification error rates depending on the number of multipaths. Referring to FIG. 9, the performance degrades as the number of multipath components increases. The reason for this is that the TxID receives more interference from the multipath.

Figure 10:
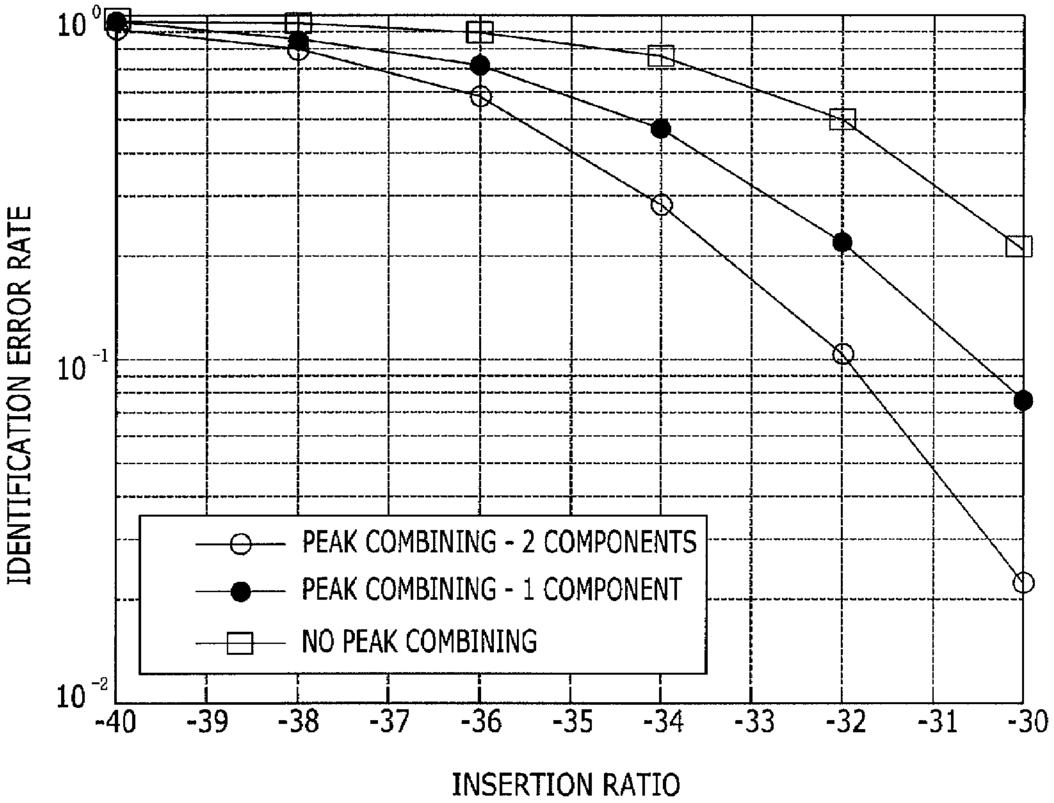
FIG. 10 is a graph comparing the identification error rates of the case of using a peak combiner in accordance with an embodiment of the present invention.

FIG. 10 illustrates that the performance is improved by using a peak combiner in accordance with the present invention. The peak combiner provides robustness in the multipath conditions, thereby making it possible to improve the performance even in the case of a multipath channel.

In the receiver, an autocorrelation peak is represented by $A+n_1$. Herein, A is an autocorrelation peak of a Kasami sequence and $n_1$ is an interference of an autocorrelation function for k=0. When P samples of the Kasami sequence are used, the correlation peak ideally becomes P. With respect to the remaining (P−1) cross-correlation functions, a correlation function $B_i+n_2$ for k=0 may take values centered on five discrete levels as Equation 18.

$$\{-t(n),-s(n),-1,s(n)-2,t(n)-2\}, \quad \text{Eq. 18}$$

In Equation 18, $t(n)=1+2^{(n+2)/2}$, $s(n)=0.5[t(n)+1]$ and $n_2$ is an interference for a cross-correlation function at k=0.

$n_1$ and $n_2$ are considered as a Gaussian distribution because they are the summations of P interference samples as the results of an autocorrelation and a cross-correlation that are sufficiently large to be considered as a Gaussian distribution.

The correct identification of TxID sequences in the presence of one cross-correlation function with a peak of $B_i+n_2$ must satisfy the criterion of $A-B_i>n_1+n_2$.

For evaluation of the probability of making a false detection, the probability density function of a new random variable Y is expressed as Equation 19. Herein, $Y>n_1+n_2$.

$$\begin{aligned} f_Y(y) &= \int_{-\infty}^{\infty} f_{N_1}(n_1) f_{N_2}(y-n_1)\,dn_1 \\ &= \int_{-\infty}^{\infty} \frac{1}{\sigma_n\sqrt{2\pi}} e^{-\frac{n_1^2}{2\sigma_n^2}} \frac{1}{\sigma_n\sqrt{2\pi}} e^{-\frac{(y-n_1)^2}{2\sigma_n^2}}\,dn_1 \\ &= \frac{1}{\sigma_n\sqrt{2\pi}} e^{\frac{y^2}{2\sigma_n^2}} \int_{-\infty}^{\infty} \frac{1}{\sigma_n\sqrt{2\pi}} e^{-\frac{2(n_1-y/2)^2-y^2/2}{2\sigma_n^2}}\,dn_1 \\ &= \frac{1}{2\sigma_n\sqrt{\pi}} e^{\frac{y^2}{4\sigma_n^2}}, \end{aligned} \quad \text{Eq. 19}$$

In Equation 19, $\sigma_n$ denotes the standard deviation of a noise component from dominant an in-band DTV noise and an AWGN noise. Therefore, the variance may be expressed as Equation 20.

$$\sigma_n^2=M(\sigma_{AWGN}^2+\sigma_{DTV}^2). \quad \text{Eq. 20}$$

The probability of making a false detection in the presence of one cross-correlation function, $B_i$ may be expressed as Equation 21.

$$\begin{aligned} P_e(n_1+n_2>A-B_i) &= \int_{A-B_i}^{\infty} \frac{1}{2\sigma_n\sqrt{\pi}} e^{-\frac{y^2}{4\sigma_n^2}}\,dy \\ &= \sqrt{2}\,\sigma_n \int_{\frac{A-B_i}{\sqrt{2}\,\sigma_n}}^{\infty} \frac{1}{2\sigma_n\sqrt{\pi}} e^{-\frac{z^2}{2}}\,dz \\ &= \frac{1}{\sqrt{2\pi}} \int_{\frac{A-B_i}{\sqrt{2}\,\sigma_n}}^{\infty} e^{-\frac{z^2}{2}}\,dz \\ &= Q\left(\frac{A-B_i}{\sqrt{2}\,\sigma_n}\right), \end{aligned} \quad \text{Eq. 21}$$

By substitution of $$\alpha = Q\left(\frac{A-B_i}{\sqrt{2}\,\sigma_n}\right),$$

Equation 21 may be expressed as Equation 22.

$$\begin{aligned} P_e(n_1+n_2<A-B_i) &= Q(\alpha) \\ &= \left\{\frac{1}{2}-\frac{1}{2}\mathrm{erf}\left(\frac{\alpha}{\sqrt{2}}\right)\right\} \end{aligned} \quad \text{Eq. 22}$$

Thus, the average probability of making a false decision in the presence of one correlation with respect to P correlation samples may be expressed as Equation 23.

$$P_e = \frac{1}{P}\sum_{k=1}^{P-1} P_k(n_1+n_2<A-B_i) \quad \text{Eq. 23}$$

Thus, the probability of making a correct decision may be expressed as Equation 24.

$$\overline{P}_e=1-P_e \quad \text{Eq. 24}$$

In the result, the probability of making a false decision may be expressed as Equation 25. Herein, L sequences are compared in the correlation and comparing process.

$$\begin{aligned} \overline{P}_{et} &= \left[1-\overline{P}_e^{(L-1)}\right] \\ &= \left[1-(1-p_e)^{L-1}\right] \end{aligned} \quad \text{Eq. 25}$$

As described above, the present invention makes it possible to provide low computational complexity and efficient hardware implementation in the identification of a transmitter in comparison with the conventional methods.

Also, the present invention makes it possible to greatly increase the DTV reception quality even in the worst-case multipath scenario by using a peak combination method.

Also, the present invention makes it possible to alleviate an unknown timing offset.

The above-described methods can also be embodied as computer programs. Codes and code segments constituting the programs may be easily construed by computer programmers skilled in the art to which the invention pertains. Furthermore, the created programs may be stored in computer-readable recording media or data storage media and may be read out and executed by the computers. Examples of the computer-readable recording media include any computer-readable recoding media, e.g., intangible media such as carrier waves, as well as tangible media such as CD or DVD.

While the present invention has been described with respect to the specific embodiments, it will be apparent to those skilled in the art that various changes and modifications may be made without departing from the spirit and scope of the invention as defined in the following claims.

What is claimed is:

1. A method for identifying a transmitter in a digital broadcasting system, the method comprising:

receiving a broadcast signal in which a TxID sequence for identification of a transmitter is embedded;

correlating the received broadcast signal with a plurality of elementary code sequences of a pseudo-random sequence sequentially, wherein the pseudo-random sequence comprises a Kasami sequence;

identifying the transmitter by using the correlation results; and wherein the Kasami sequence is generated using a first elementary code sequence (u), a second elementary code sequence (C(u")) and a third elementary code sequence (S(u')), and said correlating the received broadcast signal with a plurality of elementary code sequences of a pseudo-random sequence comprises:

multiplying the received broadcast signal by an antipodal sequence of the first elementary code sequence; and filtering a result of the multiplication by a matched filter corresponding to the second elementary code sequence and filtering the filtering result through another matched filter corresponding to the third elementary code sequence.

2. The method of claim 1, wherein said correlating the received broadcast signal with a plurality of elementary code sequences of a pseudo-random sequence sequentially is performed independently for each multipath in the case of a multipath channel.

3. The method of claim 2, wherein said identifying the transmitter by using the correlation results is performed by giving a weight to the correlation results of each multipath.

4. The method of claim 2, wherein the correlation results of each multipath are combined.

5. The method of claim 4, wherein the correlation results of each multipath are combined sequentially in the order of Signal-to-Noise Ratio (SNR).

6. The method of claim 1, further comprising averaging the TxID sequence with an unknown timing offset by multiple selections, wherein the correlation is performed on the averaged TxID sequence in the frequency domain and the correlation result is the magnitude of a correlation function.

7. The method of claim 6, wherein the TxID sequence is polarity-modulated, and the correlation result is obtained by compensating for loss caused by the selection of an adjacent Txl D sequence modulated to the opposite polarity.

8. An apparatus for identifying a transmitter in a digital broadcasting system, the apparatus comprising:

a receiver unit configured to receive a broadcast signal in which a TxID sequence for identification of a transmitter is embedded;

a correlation unit configured to correlate the received broadcast signal with a plurality of elementary code sequences of a pseudo-random sequence sequentially; wherein the pseudo-random sequence comprises a Kasami sequence; and a decision unit configured to identify the transmitter by using the correlation results, wherein the Kasami sequence is generated using a first elementary code sequence (u), a second elementary code sequence (C(u")) and a third elementary code sequence (S(u')), and the correlation unit comprises:

a first-stage processing unit configured to multiply the received broadcast signal by an antipodal sequence of the first elementary code sequence; and a second-stage processing unit configured to filter a result of the first-stage processing unit by another matched filter corresponding to the second elementary code sequence and to filter the filtering result through a matched filter corresponding to the third elementary code sequence.

9. The apparatus of claim 8, wherein the correlation unit is performed independently for each multipath in the case of a multipath channel.

10. The apparatus of claim 9, wherein the correlation unit gives a weight to the correlation results of each multipath.

11. The apparatus of claim 9, wherein the correlation results of each multipath are combined.

12. The apparatus of claim 11, wherein the correlation results of each multipath are combined sequentially in an order of Signal-to-Noise Ratio (SNR).

13. The apparatus of claim 8, wherein the correlation unit is performed in the frequency domain with respect to a TxID sequence obtained by averaging the TxID sequence with an unknown timing offset by multiple selections, and the correlation result is a magnitude of a correlation function.

14. The apparatus of claim 13, wherein the TxID sequence is polarity-modulated, and the correlation result is obtained by compensating for loss caused by the selection of an adjacent TxID sequence modulated to the opposite polarity.

* * * * *